(12) United States Patent
Chen et al.

(10) Patent No.: US 10,862,498 B1
(45) Date of Patent: Dec. 8, 2020

(54) CALIBRATION CIRCUIT AND CALIBRATION METHOD FOR ADC

(71) Applicant: REALTEK SEMICONDUCTOR CORPORATION, Hsinchu (TW)

(72) Inventors: Yu-Chang Chen, New Taipei (TW); Shih-Hsiung Huang, Miaoli County (TW); Jian-Ru Lin, Nantou County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/905,284

(22) Filed: Jun. 18, 2020

(30) Foreign Application Priority Data

Jun. 20, 2019 (TW) .............................. 108121544 A

(51) Int. Cl.
*H03M 1/46* (2006.01)
*H03M 1/10* (2006.01)

(52) U.S. Cl.
CPC ......... *H03M 1/466* (2013.01); *H03M 1/1009* (2013.01); *H03M 1/462* (2013.01)

(58) Field of Classification Search
CPC ..... H03M 1/466; H03M 1/462; H03M 1/1009
USPC ....................................................... 341/155
See application file for complete search history.

(56) References Cited

U.S. PATENT DOCUMENTS

| 10,659,069 B2 * | 5/2020 | Ali ...................... H03M 1/0641 |
| 10,715,163 B2 * | 7/2020 | Chao ................... H03M 1/1033 |
| 10,742,226 B1 * | 8/2020 | Chen ....................... H03M 1/38 |
| 10,784,882 B2 * | 9/2020 | Kang .................. H03M 1/0617 |

OTHER PUBLICATIONS

Zhu et al. "A 10.4-ENOB 120MS/s SAR ADC with DAC Linearity Calibration in 90nm CMOS", pp. 69-72, ASSCC_2013.
Chen et al. "Split Capacitor DAC Mismatch Calibration in Successive Approximation ADC", pp. 279-282, CICC 2009.
Tiilikainen, "A 14-bit 1.8-V 20-mW 1-mm2 CMOS DAC", JSSCC_2001, pp. 1144-1147, IEEE Journal of Solid-State Circuits, vol. 36, No. 7, Jul. 2001.

* cited by examiner

*Primary Examiner* — Brian K Young
(74) *Attorney, Agent, or Firm* — WPAT, PC

(57) ABSTRACT

The invention discloses a calibration circuit and a calibration method for an analog-to-digital converter (ADC). The calibration method of the ADC includes the following steps: (a) resetting the voltage at the first input of the comparator and the voltage at the second input of the comparator; (b) changing a terminal voltage of at least one capacitor in the first capacitor group; (c) the ADC generating a first digital code; (d) after the first digital code is obtained, resetting the voltage at the first input of the comparator and the voltage at the second input of the comparator; (e) changing a terminal voltage of at least one capacitor in the third capacitor group; and (f) the ADC generating a second digital code. The first digital code and the second digital code are used to correct the output of the ADC.

10 Claims, 10 Drawing Sheets

CALIBRATION CIRCUIT AND CALIBRATION METHOD FOR ADC

BACKGROUND OF THE INVENTION

1. Field of the Invention

The present invention generally relates to circuits and methods for calibrating an analog-to-digital converter (ADC), and, more particularly, to circuits and methods for calibrating an ADC which employs a bridge digital-to-analog converter (DAC).

2. Description of Related Art

FIG. 1 is a partial circuit diagram of a conventional successive approximation ADC (SA ADC). In the conversion process of the SA ADC, which includes multiple capacitor switching operations of the bridge DAC 110 and multiple comparison operations of the comparator 105, the voltages of the two input terminals of the comparator 105 approach each other, and a successive approximation register (SAR) (not shown) coupled to the output terminal of the comparator 105 generates a digital code based on the outputs of the comparator 105. After all capacitors of the bridge DAC 110 have been switched (i.e., all capacitors are coupled to their respective appropriate voltages), the digital code generated by the SAR is the final output value of the SA ADC, which is the result of analog-to-digital conversion of the input signal which is composed of Vin and Vip.

The bridge DAC 110 includes two capacitor arrays, each of which is coupled to one input terminal of the comparator 105. Each capacitor array contains a bridge capacitor 130 or 140. In the following discussion, the right side of the bridge capacitor 130 or 140 (i.e., the side close to the comparator 105) is defined as the most significant bit (MSB) side of the capacitor array, and the left side (i.e., the side away from the comparator 105) the least significant bit (LSB) side of the capacitor array. Taking the capacitor array coupled to the negative input terminal of the comparator 105 in FIG. 1 as an example, the MSB side includes the capacitors 111, 112 and 113 whose capacitance values are respectively 4 C, 2 C, and 1 C (C being a positive number), whereas the LSB side includes the capacitors 151, 152, 153, 154, and 155 whose capacitance values are 8 C, 4 C, 2 C, 1 C and 1 C, respectively. One end of the capacitors 111, 112 and 113 is coupled to one end of the bridge capacitor 130 and is directly coupled to the comparator 105, whereas one end of the capacitors 151, 152, 153, 154 and 155 is coupled to the other end of the bridge capacitor 130 and further coupled to the comparator 105 through the bridge capacitor 130, instead of being directly coupled to the comparator 105. The other end of the capacitors 111, 112, 113, 151, 152, 153, 154 and 155 which is not coupled to the bridge capacitor 130 is coupled to ground or the reference voltage Vref through the switch SW.

From the perspective of the comparator 105, all capacitors on the LSB side of one capacitor array are collectively in series with the bridge capacitor 130 or 140, and, ideally, the equivalent capacitance value of these capacitors (including the bridge capacitor 130 or 140 and all capacitors on its LSB side) is substantially equal to the capacitance value of the smallest capacitor on the MSB side. However, due to the difficulty of fabricating the bridge capacitor 130 or 140 with a precise capacitance value (because the capacitance value is not an integer multiple of the unit capacitance value) and the presence of inevitable parasitic capacitors (between one end of the bridge capacitor 130 or 140 and ground) from the capacitors on the LSB side, the linearity of the bridge DAC may decrease, which in turn causes the linearity of the SA ADC to decrease.

The document "Split Capacitor DAC Mismatch Calibration in Successive Approximation ADC" (Yanfei Chen, et al., "Split Capacitor DAC Mismatch Calibration in Successive Approximation ADC," Custom Integrated Circuits Conference, 2009. CICC '09. IEEE, pp. 279-282, September 2009) has proposed a method for calibrating a bridge DAC. This method, however, must calibrate the offset of the comparator beforehand, and only when the offset of the comparator is small enough, will the calibration result be accurate. The proposed method has the following disadvantages: (1) the process of calibrating the comparator takes extra time; and (2) it has been found in practical applications that despite the proposed method having been implemented, if there is still residual offset in the calibrated comparator, or if process, voltage or temperature (PVT) variations occur after the comparator has been calibrated, the linearity of the bridge DAC will still be poor, leading to adverse influences on the accuracy of the SA ADC. Therefore, it is necessary to provide methods and circuits for calibrating the ADC.

SUMMARY OF THE INVENTION

In view of the issues of the prior art, an object of the present invention is to provide circuits and methods for calibrating an ADC, so as to make an improvement to the prior art.

Calibration circuits and calibration method for ADCs are provided. The ADC includes a bridge digital-to-analog converter (DAC). The bridge DAC includes a first capacitor array and a second capacitor array. The first capacitor array is coupled to a first input terminal of a comparator of the ADC, and the second capacitor array is coupled to a second input terminal of the comparator. The first capacitor array includes a first capacitor group, a second capacitor group and a first bridge capacitor. The first capacitor group is electrically connected to the comparator, and the second capacitor group is coupled to the comparator through the first bridge capacitor. The second capacitor array includes a third capacitor group, a fourth capacitor group and a second bridge capacitor. The third capacitor group is electrically connected to the comparator, and the fourth capacitor group is coupled to the comparator through the second bridge capacitor.

A method for calibrating an ADC includes the following steps: (a) resetting a voltage of the first input terminal of the comparator and a voltage of the second input terminal of the comparator; (b) changing a terminal voltage of at least one capacitor in the first capacitor group; (c) the ADC generating a first digital code; (d) resetting the voltage of the first input terminal of the comparator and the voltage of the second input terminal of the comparator after the first digital code is generated; (e) changing a terminal voltage of at least one capacitor in the third capacitor group; and (f) the ADC generating a second digital code. The first digital code and the second digital code are utilized to correct the output of the ADC.

A circuit for calibrating an ADC includes a register and a control circuit. The control circuit is coupled to the bridge DAC and the register and is configured to perform a calibration procedure, which includes the following steps: (a) resetting a voltage of the first input terminal of the comparator and a voltage of the second input terminal of the comparator; (b) changing a terminal voltage of at least one capacitor in the first capacitor group; (c) storing a first digital code of the ADC to the register; (d) resetting the voltage of the first input terminal of the comparator and the voltage of the second input terminal of the comparator after the first digital code is generated; (e) changing a terminal voltage of at least one capacitor in the third capacitor group; (f) storing a second digital code of the ADC to the register. The first digital code and the second digital code are utilized to correct the output of the ADC.

According to the circuits and methods of the present invention for calibrating the ADC, the ADC can be calibrated in a simple manner Compared with the conventional calibration method, the present invention does not need to calibrate the offset of the comparator beforehand. Therefore, the circuits and methods of the present invention are easier to implement, and the calibration process is faster.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes calibration circuits and calibration methods for ADCs. On account of that some or all elements of the calibration circuits could be known, the detail of such elements is omitted provided that such detail has little to do with the features of this disclosure, and that this omission nowhere dissatisfies the specification and enablement requirements. Some or all of the processes of the calibration methods may be implemented by software and/or firmware, and can be performed by the calibration circuits or their equivalents. A person having ordinary skill in the art can choose components or steps equivalent to those described in this specification to carry out the present invention, which means that the scope of this invention is not limited to the embodiments in the specification.

Figure 1:
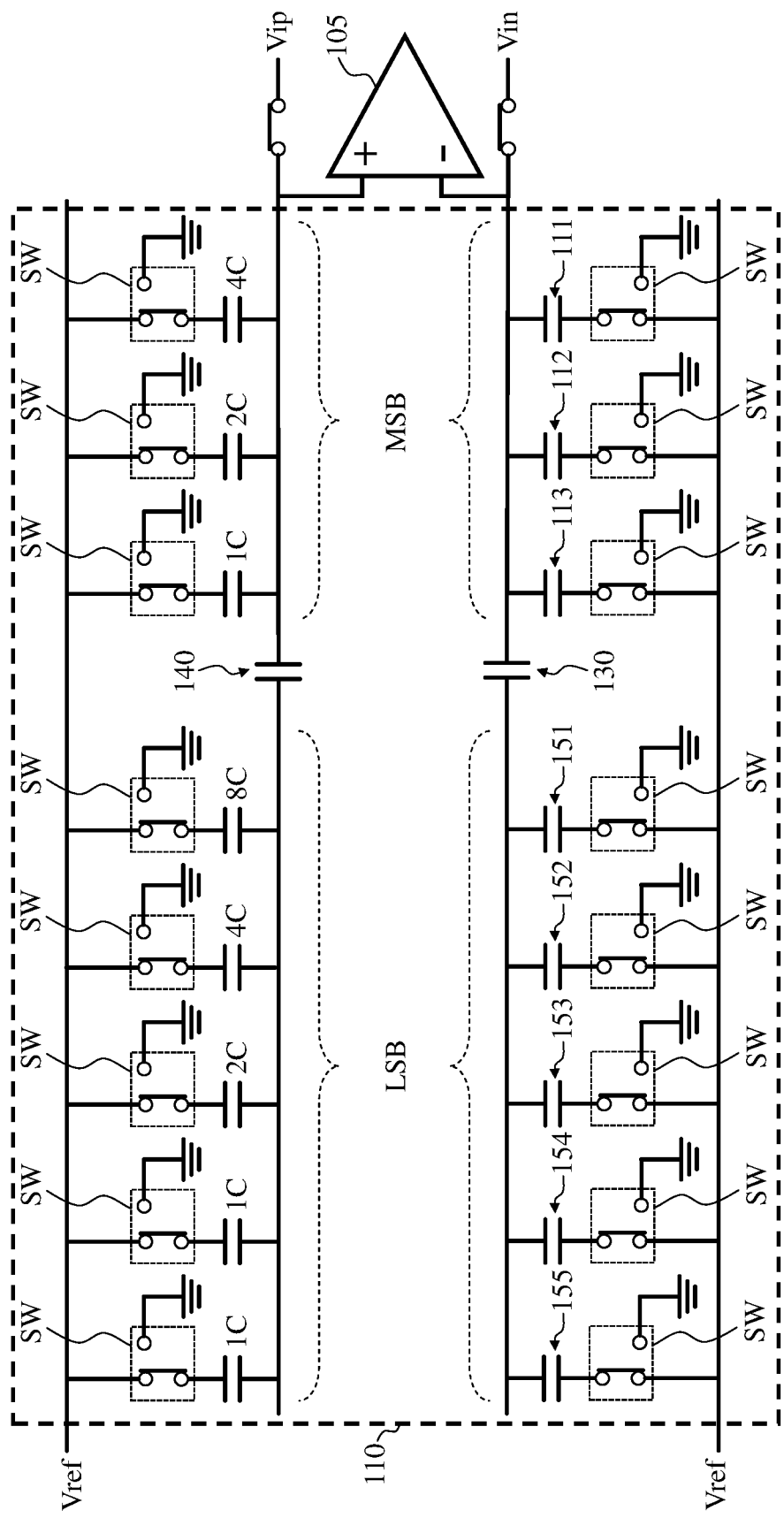
FIG. 1 illustrates a partial circuit diagram of the conventional SA ADC.
Figure 2:
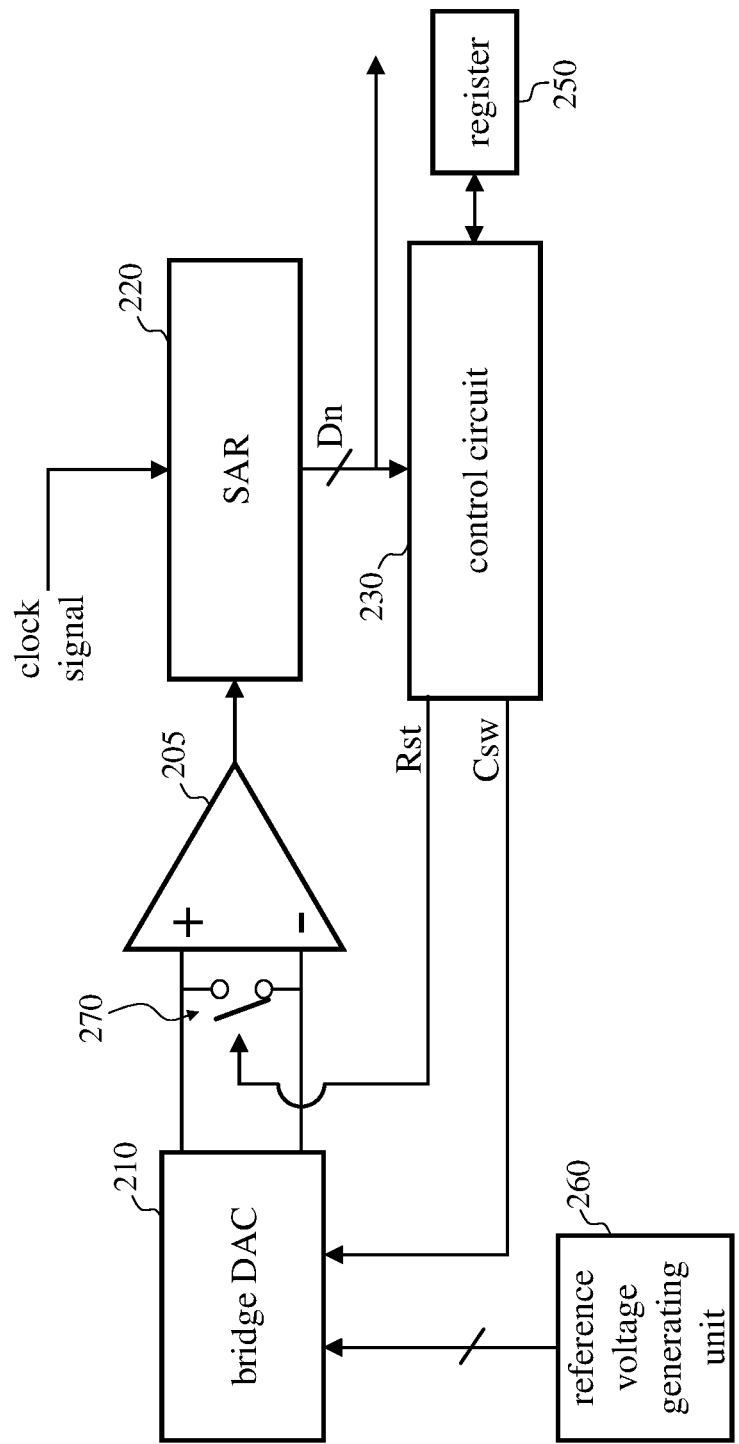
FIG. 2 illustrates a functional block diagram of a combination of the ADC calibration circuit of the present invention and the SA ADC.
Figure 3:
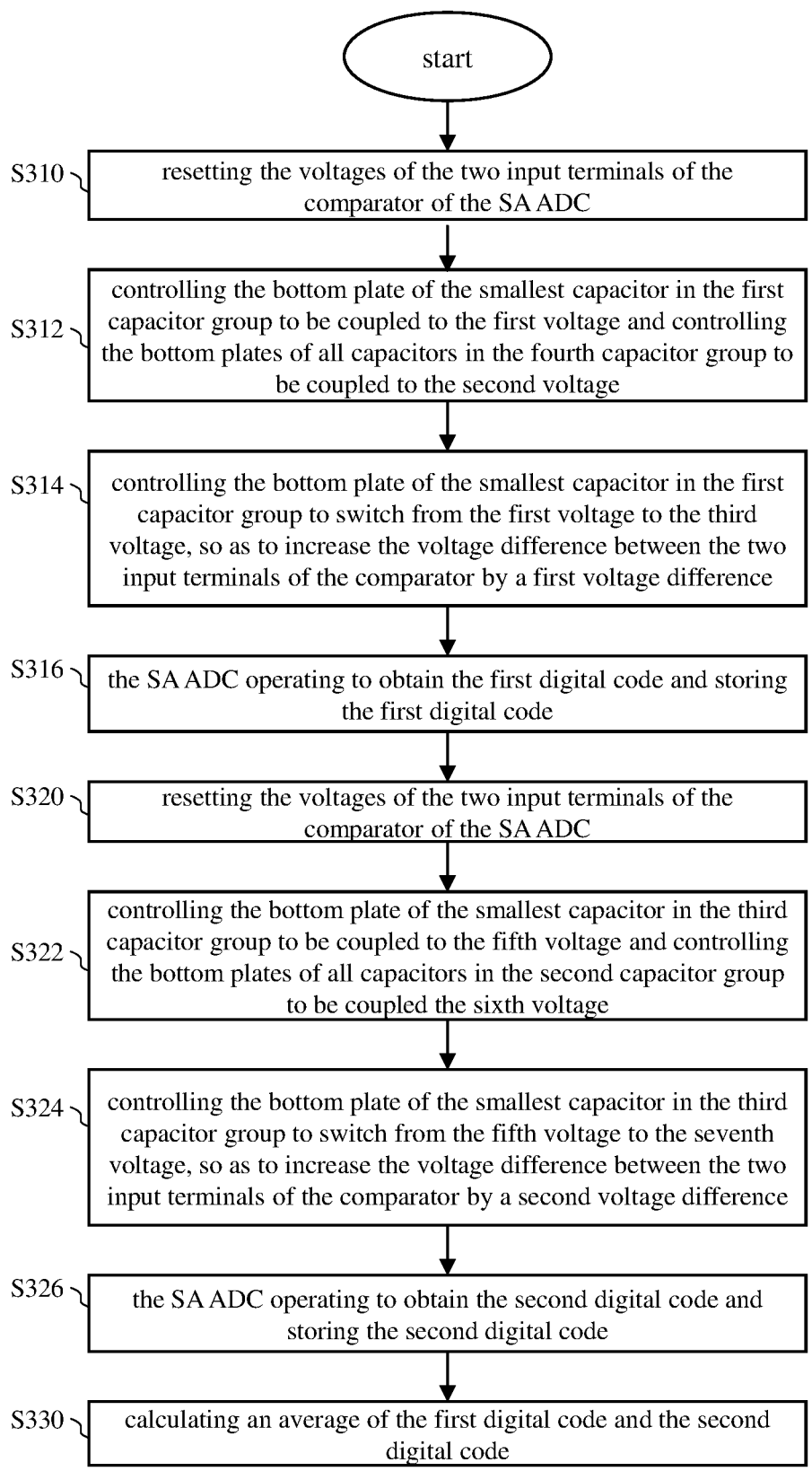
FIG. 3 illustrates a flowchart of the method of calibrating the ADC according to an embodiment of the present invention.

FIG. 2 is a functional block diagram of a combination of the ADC calibration circuit of the present invention and the SA ADC. FIG. 3 is a flowchart of the method of calibrating the ADC according to an embodiment of the present invention. FIG. 4A to FIG. 4F are schematic diagrams showing the switching states of the switches of the bridge DAC during the calibration process of the present invention. The bridge DAC 210 includes two capacitor arrays. In the following description, the capacitor array coupled to the negative input terminal of the comparator 205 is referred to as the first capacitor array, and the capacitor array coupled to the positive input terminal of the comparator 205 is referred to as the second capacitor array. The first capacitor array includes a first capacitor group (containing capacitors 411 to 413, that is, all capacitors on the MSB side), the bridge capacitor 430 and a second capacitor group (containing capacitors 451 to 455, that is, all capacitors on the LSB side). The second capacitor array includes a third capacitor group (containing capacitors 421 to 423, that is, all capacitors on the MSB side), the bridge capacitor 440 and a fourth capacitor group (containing capacitors 461 to 465, that is, all capacitors on the LSB side).

In the following description, it is assumed that the capacitance values of the capacitors 411, 412, 413, 451, 452, 453, 454, 455 are 4 C, 2 C, 1 C, 8 C, 4 C, 2 C, 1 C and 1 C, respectively, and the capacitance values of the capacitors 421, 422, 423, 461, 462, 463, 464, and 465 are 4 C, 2 C, 1 C, 8 C, 4 C, 2 C, 1 C and 1 C, respectively. In addition, in the following description, two ends of a capacitor are defined as a top plate and a bottom plate, respectively; the top plate refers to the end coupled to the comparator 205, whereas the bottom plate refers to the end not coupled to the comparator 205. Such definition is made only for the ease of discussion and not necessarily related to "top" and "bottom" in the actual circuit.

Figure 4A:
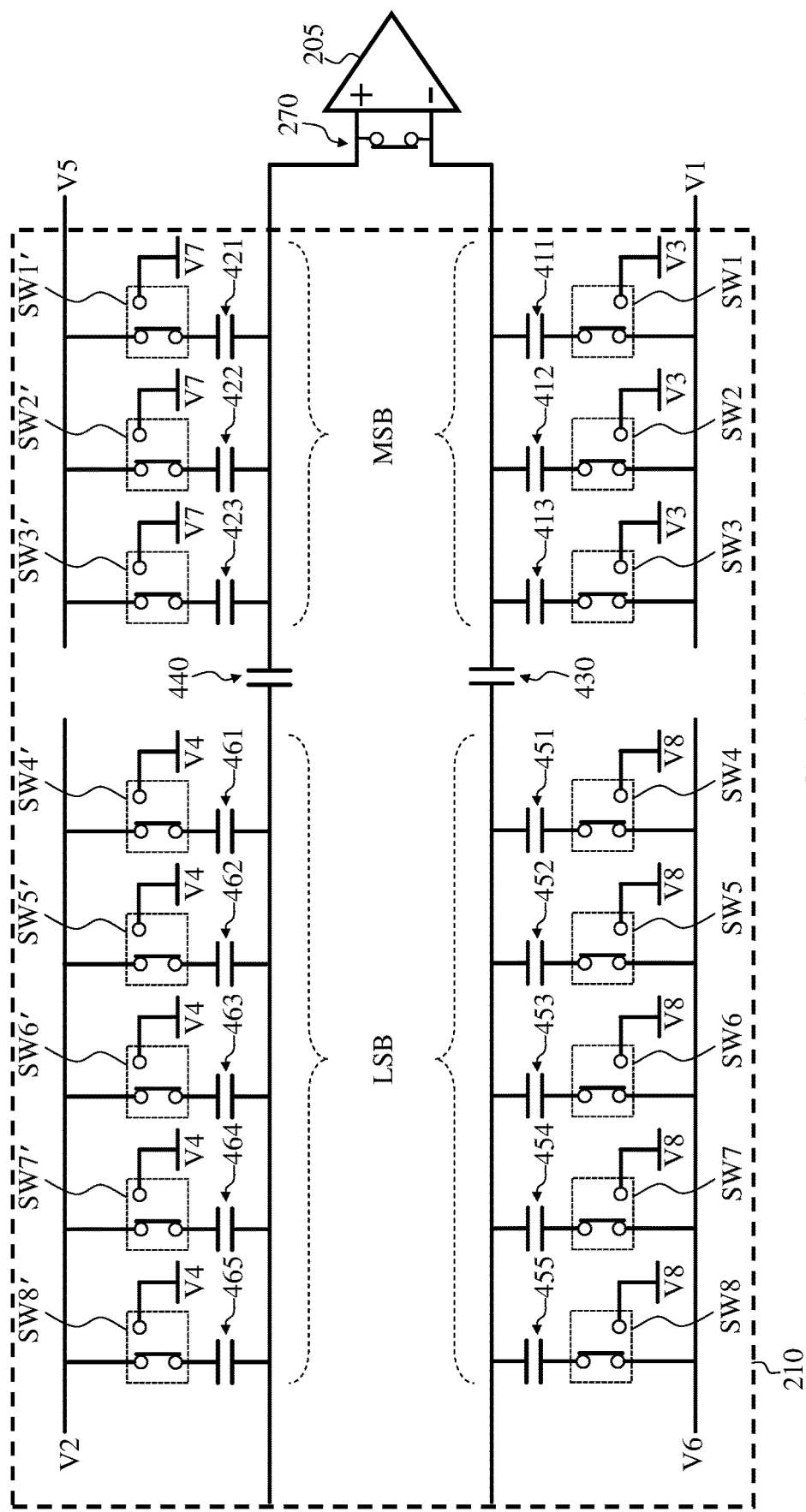
FIG. 4A to FIG. 4F are schematic diagrams showing the switching states of the switches of the bridge DAC during the calibration process of the present invention.

Before the calibration starts, the control circuit 230 first controls the SA ADC not to receive any input signal. In the calibration process, the control circuit 230 first resets the voltages of the two input terminals of the comparator 205 of the SA ADC through the control signal Rst, that is, the control circuit 230 controls the positive and negative input terminals of the comparator 205 to have the same voltage (step S310). For example, in step 310, the control circuit 230 may control the switch 270 to turn on so that the voltages of the two input terminals of the comparator 205 are equal (as shown in FIG. 4A).

Figure 4B:
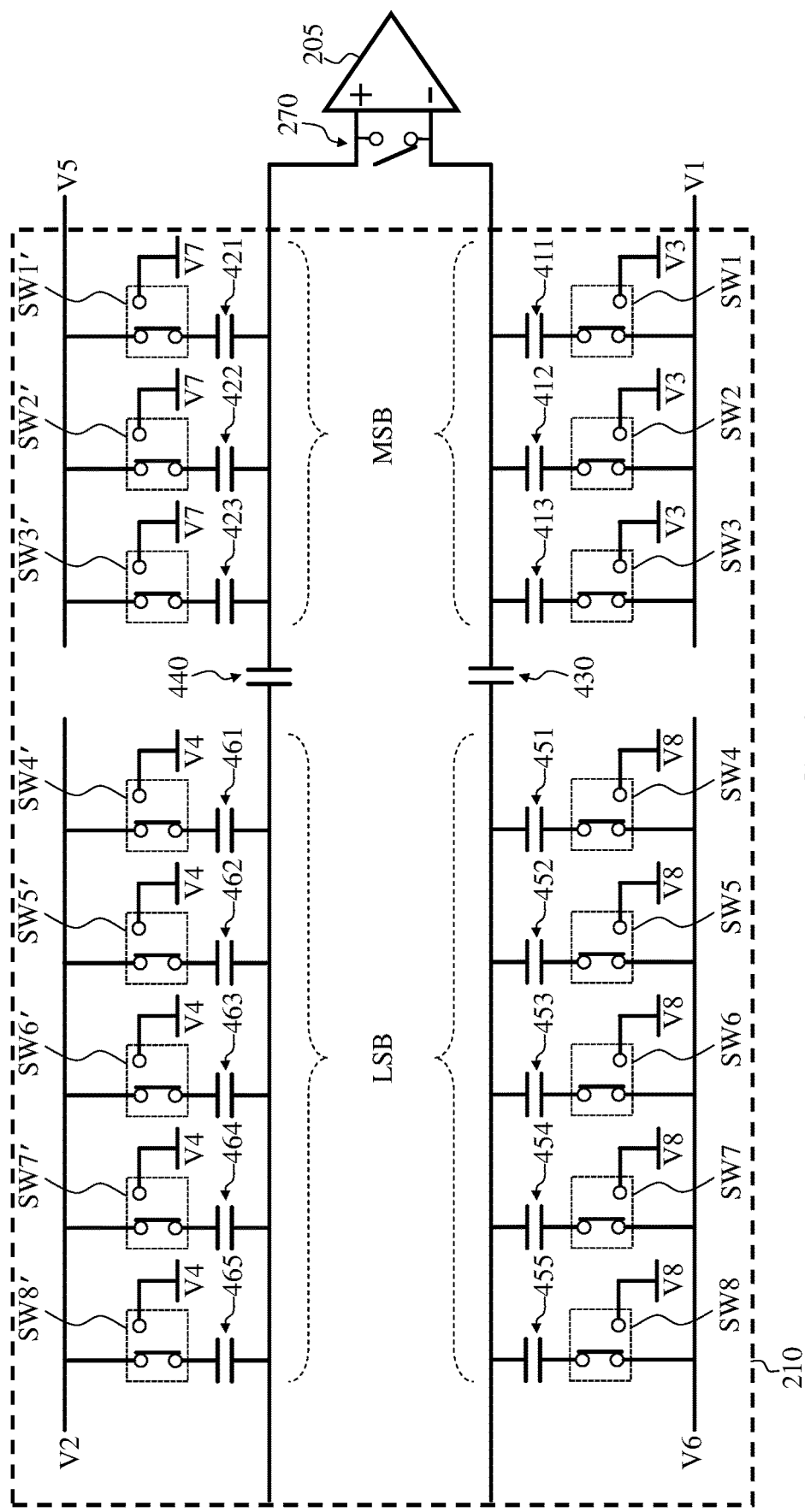

After the reset operation is completed, the control circuit 230 controls the switch 270 to turn off, and then controls the bottom plate of the smallest capacitor 413 in the first capacitor group to be coupled to the first voltage V1 and controls the bottom plates of all capacitors in the fourth capacitor group to be coupled to the second voltage V2 (as shown in FIG. 4B) (step S312). Through the control signal Csw, the control circuit 230 controls the switches SW1 to SW8 and the switches SW1' to SW8' to turn on or off. The switches SW1 to SW3 correspond respectively to capacitors 411 to 413, switches SW4 to SW8 correspond respectively to capacitors 451 to 455, switches SW1' to SW3' correspond respectively to capacitors 421 to 423, and switches SW4' to SW8' correspond respectively to capacitors 461 to 465.

Figure 4C:
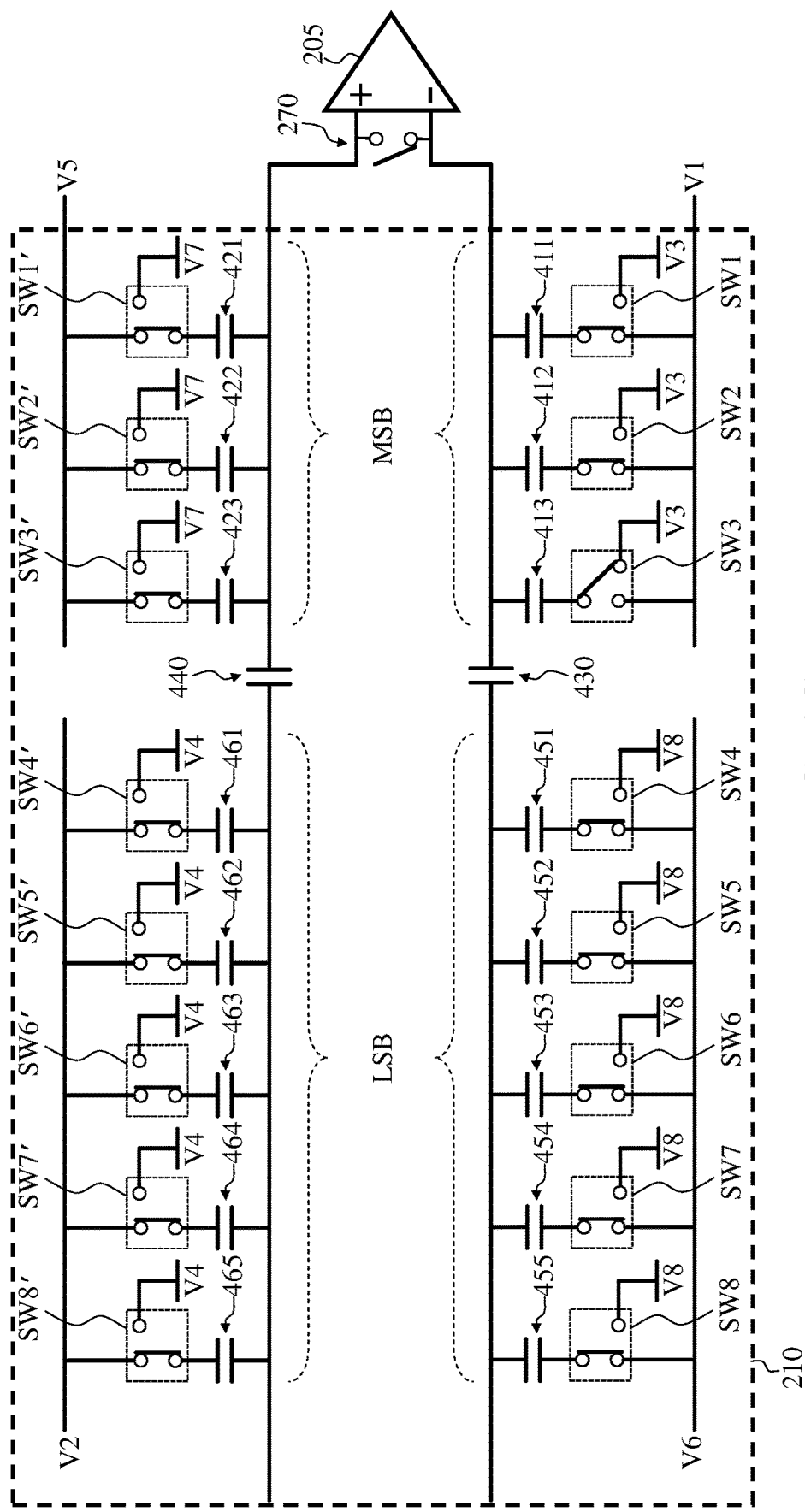

Next, the control circuit 230 controls the bottom plate of the smallest capacitor 413 in the first capacitor group to switch from the first voltage V1 to the third voltage V3, so as to increase the voltage difference between the two input terminals of the comparator 205 by a first voltage difference ΔV1. The third voltage is different from the first voltage (as shown in FIG. 4C) (step S314).

Figure 4D:
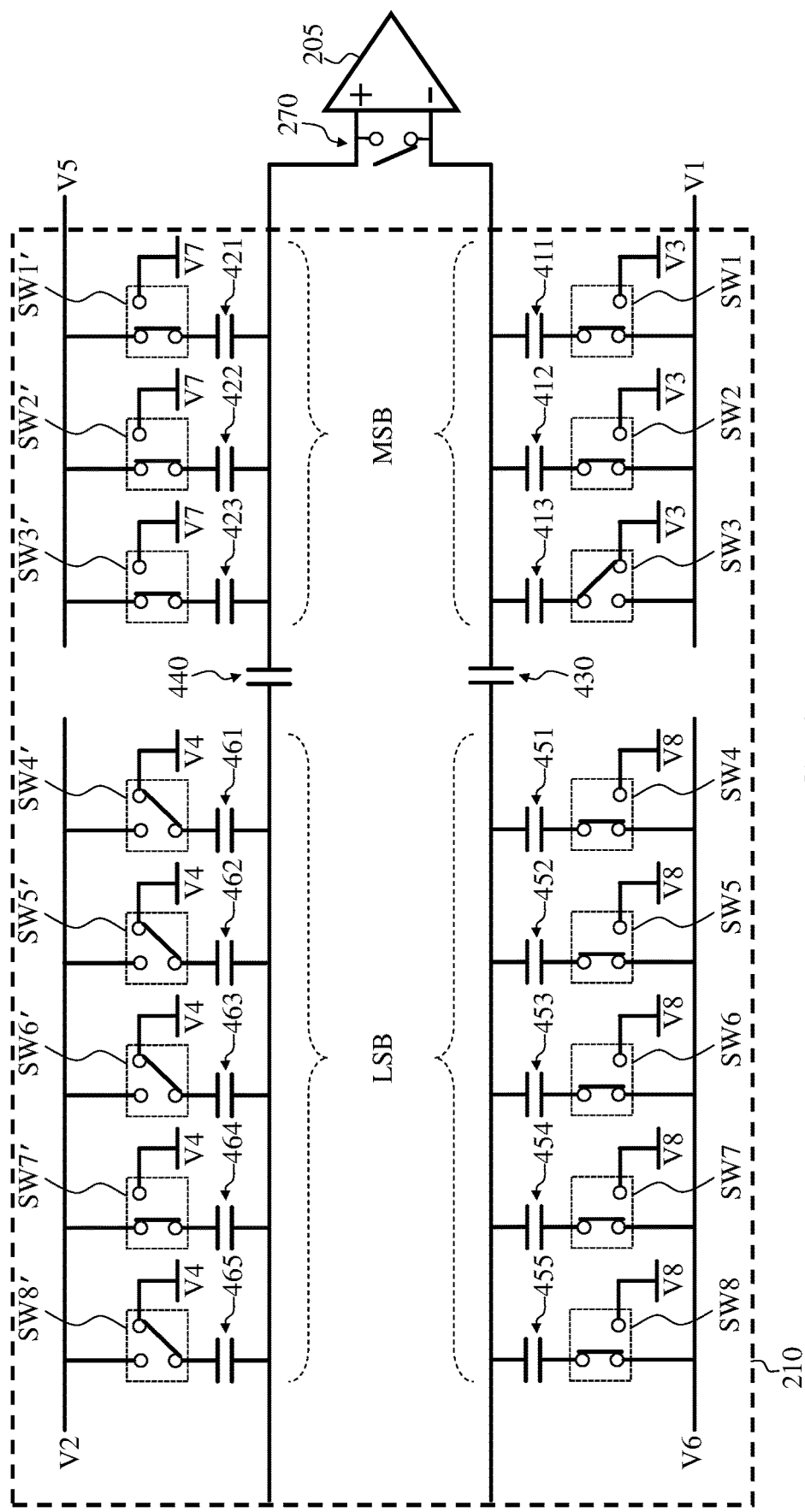

Next, in several operation cycles (controlled by the clock signal) of the SA ADC, the successive approximation register (SAR) 220 generates a digital code Dn according to the outputs of the comparator 205, and the control circuit 230 then determines, according to the digital code Dn, the ON/OFF states of the switches SW4' to SW8' (i.e., determines the voltages (electrical potentials) to which each of the capacitors 461, 462, 463, 464 and 465 couples) (step S316). In other words, the SA ADC is subject to multiple capacitor switching operations, which determine the voltages of the bottom plates of the capacitors in the fourth capacitor group, and multiple comparison operations in step S316. The final switching state is shown in FIG. 4D—the bottom plates of the capacitors 461, 462, 463 and 465 are switched from the second voltage V2 to the fourth voltage V4, and the bottom plate of the capacitor 464 remains coupled to the second voltage V2. The voltage difference (V1−V3) between the first voltage V1 and the third voltage V3 is substantially equal to the voltage difference (V2−V4) between the second voltage V2 and the fourth voltage V4. At the end of step S316, the SA ADC generates a first digital code D1, and the control circuit 230 stores the first digital code D1 to the register 250. The first digital code D1 corresponding to FIG. 4D is 00011101. Because the capacitor 455 is a dummy capacitor, which is only used for calibration and not for practical operation, the binary and decimal values corresponding to the first digital code D1 are $0001110_2+1$ and $14_{10}+1$, respectively.

Next, the control circuit 230 resets the voltages of the two input terminals of the comparator 205 of the SA ADC again through the control signal Rst (as shown in FIG. 4A) (step S320).

After the reset operation is completed, the control circuit 230 controls the switch 270 to turn off, and then controls the bottom plate of the smallest capacitor 423 in the third capacitor group to be coupled to the fifth voltage V5 and controls the bottom plates of all capacitors in the second capacitor group to be coupled to the sixth voltage V6 (as shown in FIG. 4B) (step S322).

Figure 4E:
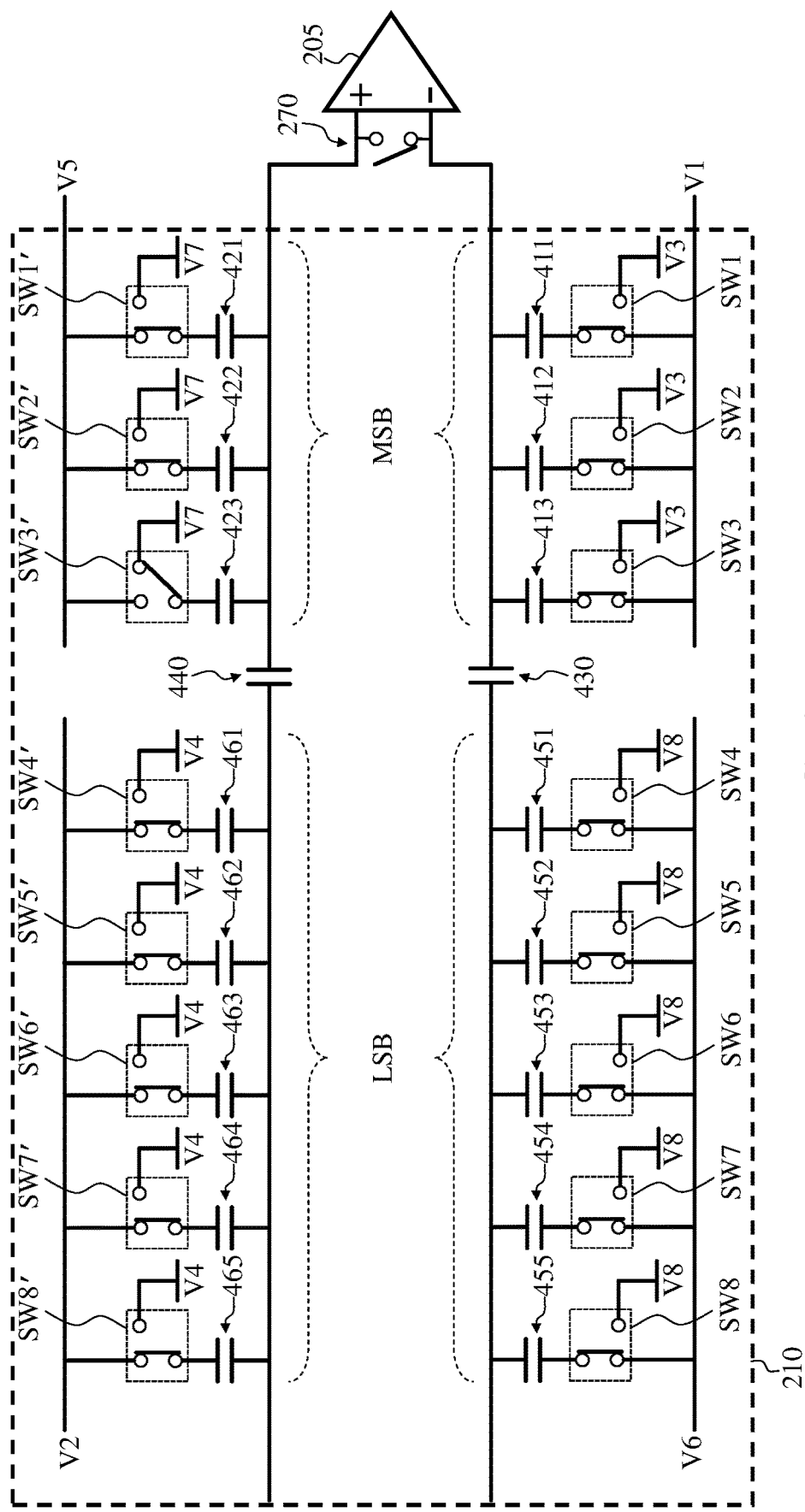

Next, the control circuit 230 controls the bottom plate of the smallest capacitor 423 in the third capacitor group to switch from the fifth voltage V5 to the seventh voltage V7, so as to increase the voltage difference between the two input terminals of the comparator 205 by a second voltage difference $\Delta V2$. The seventh voltage is different from the fifth voltage (as shown in FIG. 4E) (step S324).

Figure 4F:
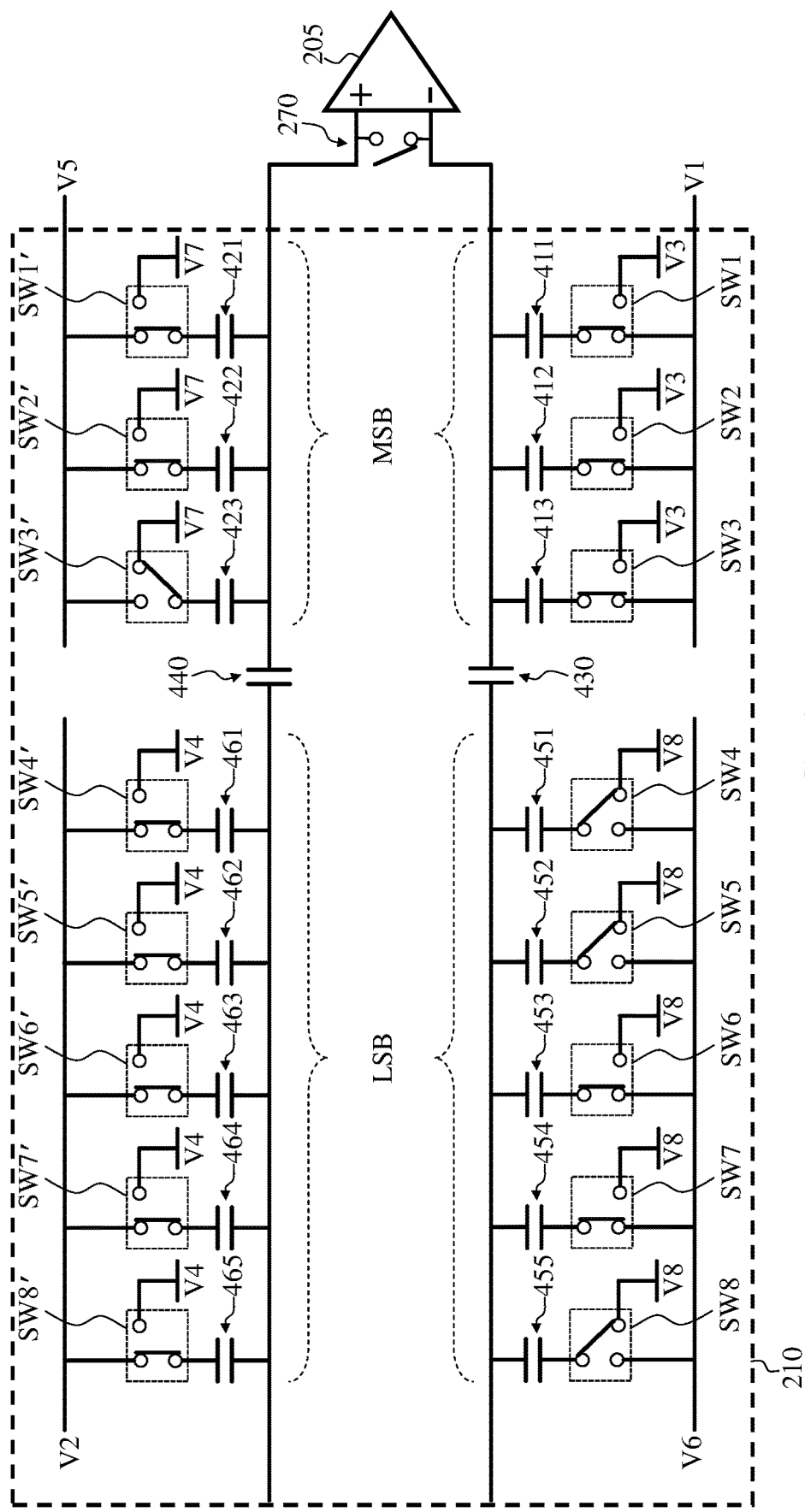

Next, in several operation cycles (controlled by the clock signal) of the SA ADC, the SAR 220 generates the digital code Dn according to the outputs of the comparator 205, and the control circuit 230 then determines, according to the digital code Dn, the ON/OFF states of the switches SW4 to SW8 (i.e., determines the voltages (electrical potentials) to which each of the capacitors 451, 452, 453, 454 and 455 couples) (step S326). In other words, the SA ADC is subject to multiple capacitor switching operations, which determine the voltages of the bottom plates of the capacitors in the second capacitor group, and multiple comparison operations in step S326. The final switching state is shown in FIG. 4F—the bottom plates of the capacitors 451, 452 and 455 are switched from the sixth voltage V6 to the eighth voltage V8, and the bottom plates of the capacitors 453 and 454 remain coupled to the sixth voltage V6. The voltage difference (V5−V7) between the fifth voltage V5 and the seventh voltage V7 is substantially equal to the voltage difference (V6−V8) between the sixth voltage V6 and the eighth voltage V8. At the end of step S326, the SA ADC generates a second digital code D2, and the control circuit 230 stores the second digital code D2 to the register 250. The second digital code D2 corresponding to FIG. 4F is 00011001. Because the capacitor 465 is a dummy capacitor, which is only used for calibration and not for practical operation, the binary and decimal values corresponding to the second digital code D2 are $0001100_2+1$ and $12_{10}+1$, respectively.

Finally, in some embodiments, the control circuit 230 calculates an average of the first digital code D1 and the second digital code D2 (step S330). More specifically, assuming that there is a voltage offset $Vos=V_+-V_-$ between the positive input terminal ($V_+$) and the negative input terminal ($V_-$) of the comparator 205, the first digital code D1 reflects the sum of the first voltage difference $\Delta V1$ and the voltage offset Vos, namely, $D1=\Delta V1+Vos$, and the second digital code D2 reflects the difference between the second voltage difference $\Delta V2$ and the voltage offset Vos, namely, $D2=\Delta V2-Vos$. The average of the first digital code D1 and the second digital code D2 is $(D1+D2)/2=(\Delta V1+\Delta V2)/2$. When the capacitor 413 and the capacitor 423 are substantially the same (i.e., $\Delta V1=\Delta V2=\Delta V$), $(D1+D2)/2=\Delta V$. In other words, $(D1+D2)/2$ can represent the analog ratio (which is also the digital ratio) of the capacitance value of the capacitor 413 to the capacitance value of the smallest capacitor (454 or 455) in the second capacitor group, or represent the analog ratio (which is also the digital ratio) of the capacitance value of the capacitor 423 to the capacitance value of the smallest capacitor (464 or 465) in the fourth capacitance group. For the example circuits of FIGS. 4D and 4F, the average $R=(D1+D2)/2=(0001111_2+0001101_2)/2=(15_{10}+13_{10})/2=14_{10}$.

The control circuit 230 may calculate the calibration factor $\alpha$ of the SA ADC according to the average R. The calibration factor $\alpha$ is the ratio of the average R to the ideal weight of the smallest capacitor in the first capacitor group (i.e., the capacitor 413) or to the ideal weight of the smallest capacitor in the third capacitor group (i.e., the capacitor 423). The circuit (not shown) that follows the SA ADC (i.e., the post-stage circuit of the SA ADC) can correct, according to the calibration factor $\alpha$, the digital code Dn generated by the SA ADC. Take the first capacitor array as an example, because the ideal digital weights (decimal) of the capacitors 454, 453, 452, 451, 413, 412 and 411 are 1, 2, 4, 8, 16, 32 and 64, respectively, the calibration factor $\alpha$ is 14/16. Only the first capacitor group and the third capacitor group need correct the weight, while the second capacitor group and the fourth capacitor group need not correct the weight. After corrected with the calibration factor $\alpha$, the actual weights of the capacitors 413 (or 423), 412 (or 422), 411 (or 421) become $16*\alpha=14$, $32*\alpha=28$, and $64*\alpha=56$, respectively.

In some embodiments, the control circuit 230 does not calculate the average R and the calibration factor $\alpha$. Instead, the circuit that follows the SA ADC reads the first digital code D1 and the second digital code D2 from the register 250 and calculate the average R and the calibration factor $\alpha$ accordingly.

The invention has the following advantages: (1) there is no need to calibrate the offset of the comparator; (2) there is no need to calibrate the capacitance values of the bridge DAC 210; (3) the calibration factor of the ADC can be obtained quickly (only two digital codes are needed); and (4) no specific input signal is required.

Figure 5:
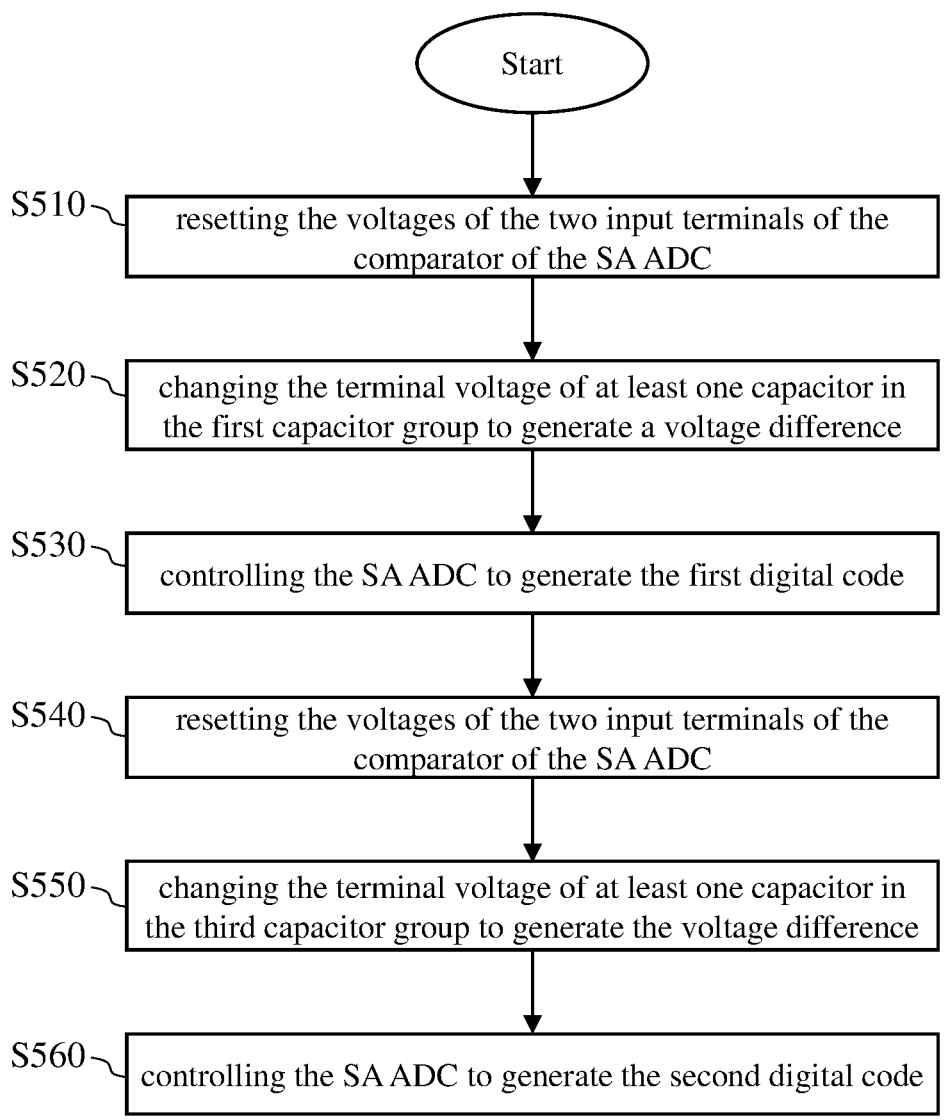
FIG. 5 illustrates a flowchart of the method of calibrating the ADC according to another embodiment of the present invention.

The above-mentioned calibration process can be summarized in FIG. 5, which includes the following steps: first, resetting the voltages of the two input terminals of the comparator of the SA ADC (step S510, corresponding to FIG. 4A); changing the terminal voltage of at least one capacitor in the first capacitor group to generate a voltage difference (step S520, corresponding to the transition from FIG. 4B to FIG. 4C); next, controlling the SA ADC to generate the first digital code (step S530, corresponding to the transition from FIG. 4C to FIG. 4D); next, resetting the voltages of the two input terminals of the comparator of the SA ADC (step S540, corresponding to FIG. 4A); changing the terminal voltage of at least one capacitor in the third capacitor group to generate the voltage difference (step S550, corresponding to the transition from FIG. 4B to FIG. 4E); next, controlling the SA ADC to generate the second digital code (step S560, corresponding to the transition from FIG. 4E to FIG. 4F). After the first digital code and the second digital code are obtained, the post-stage circuit of the SA ADC can correct the outputs of the SA ADC according to the first digital code and the second digital code.

In some embodiments, V1=V2 and V3=V4. In some embodiments, V5=V6 and V7=V8. In other embodiments, V1=V2=V5=V6 and V3=V4=V7=V8. The voltages V1 to V8 may be generated by the reference voltage generating unit 260.

Although the above description takes SA ADC as an example, the calibration circuit and the calibration method of the present invention can be applied to other circuits employing a bridge DAC, such as the analog gain stage of an operational amplifier. For operational amplifiers, whether the operational amplifier has offset or not, the present invention can obtain the ratio of the equivalent capacitance value on the left side of the bridge capacitor and to the equivalent capacitance value on the right side of the bridge capacitor.

Since a person having ordinary skill in the art can appreciate the implementation detail and the modification thereto of the present method invention through the disclosure of the device invention, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A method for calibrating an analog-to-digital converter (ADC), the ADC including a bridge digital-to-analog converter (DAC), the bridge DAC including a first capacitor array and a second capacitor array, the first capacitor array being coupled to a first input terminal of a comparator of the ADC, the second capacitor array being coupled to a second input terminal of the comparator, the first capacitor array including a first capacitor group, a second capacitor group and a first bridge capacitor, the first capacitor group being electrically connected to the comparator, the second capacitor group being coupled to the comparator through the first bridge capacitor, the second capacitor array including a third capacitor group, a fourth capacitor group and a second bridge capacitor, the third capacitor group being electrically connected to the comparator, and the fourth capacitor group being coupled to the comparator through the second bridge capacitor, the method comprising:

(a) resetting a voltage of the first input terminal of the comparator and a voltage of the second input terminal of the comparator;
(b) changing a terminal voltage of at least one capacitor in the first capacitor group;
(c) the ADC generating a first digital code;
(d) resetting the voltage of the first input terminal of the comparator and the voltage of the second input terminal of the comparator after the first digital code is generated;
(e) changing a terminal voltage of at least one capacitor in the third capacitor group; and
(f) the ADC generating a second digital code;
wherein the first digital code and the second digital code are utilized to correct an output of the ADC.

2. The method of claim 1, wherein step (b) causes at least one capacitor in the first capacitor group to switch from a first voltage to a third voltage, step (c) causes at least one capacitor in the fourth capacitor group to switch from a second voltage to a fourth voltage, and a voltage difference between the first voltage and the third voltage is substantially equal to a voltage difference between the second voltage and the fourth voltage.

3. The method of claim 2, wherein the first voltage is equal to the second voltage, and the third voltage is equal to the fourth voltage.

4. The method of claim 2, wherein step (e) causes at least one capacitor in the third capacitor group to switch from a fifth voltage to a seventh voltage, step (f) causes at least one capacitor in the second capacitor group to switch from a sixth voltage to an eighth voltage, a voltage difference between the fifth voltage and the seventh voltage is substantially equal to a voltage difference between the sixth voltage and the eighth voltage, and a voltage difference between the first voltage and the third voltage is substantially equal to a voltage difference between the fifth voltage and the seventh voltage.

5. The method of claim 4, wherein the fifth voltage is equal to the sixth voltage, and the seventh voltage is equal to the eighth voltage.

6. A calibration circuit for calibrating an analog-to-digital converter (ADC), the ADC including a bridge digital-to-analog converter (DAC), the bridge DAC including a first capacitor array and a second capacitor array, the first capacitor array being coupled to a first input terminal of a comparator of the ADC, the second capacitor array being coupled to a second input terminal of the comparator, the first capacitor array including a first capacitor group, a second capacitor group and a first bridge capacitor, the first capacitor group being electrically connected to the comparator, the second capacitor group being coupled to the comparator through the first bridge capacitor, the second capacitor array including a third capacitor group, a fourth capacitor group and a second bridge capacitor, the third capacitor group being electrically connected to the comparator, and the fourth capacitor group being coupled to the comparator through the second bridge capacitor, the calibration circuit comprising:

a register; and
a control circuit, coupled to the bridge DAC and the register and configured to perform a calibration procedure including following steps:
(a) resetting a voltage of the first input terminal of the comparator and a voltage of the second input terminal of the comparator;
(b) changing a terminal voltage of at least one capacitor in the first capacitor group;

(c) storing a first digital code of the ADC to the register;
(d) resetting the voltage of the first input terminal of the comparator and the voltage of the second input terminal of the comparator after the first digital code is generated;
(e) changing a terminal voltage of at least one capacitor in the third capacitor group;
(f) storing a second digital code of the ADC to the register;

wherein the first digital code and the second digital code are utilized to correct an output of the ADC.

7. The calibration circuit of claim 6, wherein step (b) causes at least one capacitor in the first capacitor group to switch from a first voltage to a third voltage, step (c) causes at least one capacitor in the fourth capacitor group to switch from a second voltage to a fourth voltage, and a voltage difference between the first voltage and the third voltage is substantially equal to a voltage difference between the second voltage and the fourth voltage.

8. The calibration circuit of claim 7, wherein the first voltage is equal to the second voltage, and the third voltage is equal to the fourth voltage.

9. The calibration circuit of claim 7, wherein step (e) causes at least one capacitor in the third capacitor group to switch from a fifth voltage to a seventh voltage, step (f) causes at least one capacitor in the second capacitor group to switch from a sixth voltage to an eighth voltage, a voltage difference between the fifth voltage and the seventh voltage is substantially equal to a voltage difference between the sixth voltage and the eighth voltage, and a voltage difference between the first voltage and the third voltage is substantially equal to a voltage difference between the fifth voltage and the seventh voltage.

10. The calibration circuit of claim 9, wherein the fifth voltage is equal to the sixth voltage, and the seventh voltage is equal to the eighth voltage.

\* \* \* \* \*